United States Patent
Lin et al.

(10) Patent No.: US 7,012,307 B2
(45) Date of Patent: Mar. 14, 2006

(54) OUTPUT BUFFER WITH GOOD ESD PROTECTION

(75) Inventors: Shi-Tron Lin, Taipei (TW); Wei-Fan Chen, Taichung (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/779,096

(22) Filed: Feb. 8, 2001

(65) Prior Publication Data

US 2001/0033004 A1 Oct. 25, 2001

(30) Foreign Application Priority Data

Apr. 21, 2000 (TW) ........................................ 89107542 A

(51) Int. Cl.
*H01L 23/62* (2006.01)

(52) U.S. Cl. ........................ 257/360; 257/355; 257/356; 257/363

(58) Field of Classification Search ......... 257/355–363; 361/56, 91
See application file for complete search history.

(56) References Cited

U.S. PATENT DOCUMENTS

| | | | | |
|---|---|---|---|---|
| 5,343,053 A | * | 8/1994 | Avery | 257/173 |
| 5,572,394 A | * | 11/1996 | Ker et al. | 361/56 |
| 5,670,814 A | * | 9/1997 | Wu et al. | 257/360 |
| 5,686,751 A | * | 11/1997 | Wu | 257/356 |
| 5,903,420 A | * | 5/1999 | Ham | 361/56 |
| 6,355,959 B1 | * | 3/2002 | Vashchenko et al. | 257/355 |

FOREIGN PATENT DOCUMENTS

JP 1-276769 * 11/1989

* cited by examiner

*Primary Examiner*—Ori Nadav
(74) *Attorney, Agent, or Firm*—Ladas & Parry LLP

(57) ABSTRACT

An output buffer with a pull down circuit. The pull down circuit is coupled between a second power line and a pad, and has a resistor, a diode and an electrostatic discharge protection component. The resistor deposited on the substrate of a first conductivity type includes a well region of a second conductivity type. The resistor and the electrostatic discharge protection component are connected in series between the pad and the second power line. The diode is formed in the well region, construct by the PN junction formed between a first doped region of the first conductivity type and the well region. The first doped region is electrically floated in the well regions. During an electrostatic discharge event, the pad is instantaneously connected to the first doped region which will help to boost the turn-on of the electrostatic discharge circuit, and further enhance the electrostatic protection effect.

4 Claims, 10 Drawing Sheets

OUTPUT BUFFER WITH GOOD ESD PROTECTION

BACKGROUND OF THE INVENTION

1. Field of the Invention

The present invention generally relates to an output buffer with good electrostatic discharge protection. More specifically, the present invention relates to an output buffer which prevents voltage ringing and overshooting and apart from providing good electrostatic discharge protection.

2. Description of the Related Art

When an integrated circuit (i.e. IC) is located on a mother board, the CMOS I/O buffer can have large shooting and overshooting due to the wiring capacitance and inductance from the IC package and wiring of mother board. Traditionally, an external resistor in the order of 10 ohms can be soldered to a mother board next to a CMOS I/O pin, thus providing a series resistor to dampen the voltage ringing and overshooting, as shown in FIG. 1A. In FIG. 1A, CMOS I/O buffer 2 comprises an output buffer 3, a secondary ESD protection circuit 4 and an input buffer 5. Wherein, output buffer 3 comprises a pull up PMOS P1 and a pull down NMOS N1. Because output buffer 3 needs to provide a large driving ability, both PMOS P1 and NMOS N1 have gate widths wide enough, such that they can act as a main ESD protection circuit. Secondary ESD protection circuit 4, as shown in FIG. 1A, comprises a 200 ohms resistor coupled between input buffer 5 and PAD 10 to minimize the effect of ESD on input buffer 5. Hence, PMOS P2 and NMOS N2 for dissipating the ESD current are miniaturized to be smaller than output buffer 3. The externally connected resistor 7 increases the load of output buffer 3 and suppress the voltage ringing and overshooting caused by wiring capacitance and inductance from the IC package. However, the participation of an extra part, such as resistor 7, is extravagant in view of motherboard integration. It increases the total area of motherboard and the complexity of part management. Thus the design in FIG. 1A is not well considered.

Another method for suppressing voltage ringing and overshooting is by removing the external resistor 7, and adding two on-chip resistors in series with the PMOS P1 and NMOS N1 respectively, as shown in FIG. 1B. Thus, pull up PMOS p1 is provided with a resistor Rp, pull down NMOS is provided with a resistor Rn. The driving ability of I/O buffer is hence diminished by the addition of the two resistors Rn and Rp. Thus the voltage ringing and overshooting at the pad will be smaller. The larger resistance values of resistors Rn and Rp, the better its damping effect on voltage ringing and overshooting. However, the resistance of Rn and Rp should not be so large that the driving ability cannot meet the requirement of the CMOS I/O buffer. For example, the required driving ability of the NMOS N1 is to drain a DC current of about 8 to 10 mA and a maximum transient current of about 40 mA, further with a specification of voltage overload (VOL) about 0.4 V. In order to comply with the limit of the VOL specification, the resistance of resistor Rn cannot be more than 10 ohms. The resistor Rn of 10 ohms contributes a voltage drop of 0.1 volt when the NMOS drains the DC current of 10 mA. Thus the pull down circuit can comply with the VOL specification.

SUMMARY OF THE INVENTION

An object of the present invention is to provide a novel and improved buffer for improving ESD performance without causing any adverse effects to the performance of the voltage ringing and overshooting suppression.

The present invention achieves the above-indicated objects by providing an output buffer. The output buffer of the present invention comprises a pull up circuit and a pull down circuit. The pull up circuit is coupled between a first power line and a pad; the pull down circuit coupled between a second power line and a pad is comprised of a resistor, a diode and an ESD protection component. The resistor deposited on a substrate of a first conductivity type is comprised of a well region of a second conductivity type. The resistor has a first end and a second end. The first end is a doped region of the second conductivity type at least partially overlapping the well region and coupled to the pad. The diode is formed in the well region and constructed of a PN junction formed between the well region and a first doped region of the first conductivity type. The electrostatic discharge component is coupled to the second end and the second power line. Wherein, the first doped region is electrically floated in the well region.

Because the first doped region and the first end are not connected directly, no latch-up issue occurring in the normal circuit operation. During the electrostatic discharge event, the first end is instantaneously coupled to the first doped region. The phenomenon will help to boost the conductivity of the ESD protection circuit, and further enhance the ESD protection effect.

The present invention further provides an ESD protection circuit, coupled to a first pad and a second pad. The electrostatic discharge protection circuit of the present invention is comprised of a resistor, a diode and an ESD protection component. The resistor composed of a well region of a second conductivity type is deposited on the substrate of the first conductivity type and coupled to the first pad. The diode is formed in the well region and constructed by the junction formed between a first doped region of the second conductivity type and the well region. The ESD protection component is coupled between the resistor and the second pad. Wherein, the first doped region is electrically floated, or coupled by a capacitor to the first pad.

Similar to the above embodiment, because the first doped region and the first pad are not connected directly, there is no latch-up issue occurring in the normal circuit operation. During the electrostatic discharge event, the first pad is instantaneously coupled to the first doped region which will help to boost the conductivity of the ESD protection circuit, and further enhance the ESD protection effect.

The ESD protection component could be a MOS transistor of the second conductivity type.

It is an advantage of the present invention that, because the MOS transistor is connected to a well resistor in series, the buffer of the present invention is able to suppress the voltage ringing and overshooting. Furthermore, during an ESD event, the first doped region of the electrically floated diode is transiently coupled to the first end to project carriers from the first doped region to the well and the substrate which triggers the conductivity of the ESD component.

These and further features, aspects and advantages of the present invention, as well as the structure and operation of various embodiments thereof, will become readily apparent with reference to the following detailed description of a presently preferred, but nonetheless illustrative embodiment when read in conjunction with the accompanying drawings, in which like reference numbers indicate identical or functionally similar elements throughout the numerated Figures.

BRIEF DESCRIPTION OF THE DRAWINGS

The drawings referred to herein will be understood as not being drawn to scale except if specially noted, the emphasis instead being placed upon illustrating the principles of the present invention. In the accompanying drawings.

DETAILED DESCRIPTION OF THE PREFERRED EMBODIMENTS

The present invention provides an output buffer that has improved performance in ESD protection and can suppress the voltage ringing and overshooting during normal circuit operation. For the purpose of illustration, p-type is exampled as the first conductivity type and n-type is exampled as the second conductivity type. Alternatively, n-type can be the first conductivity type while p-type being the second conductivity type.

Figure 1A:
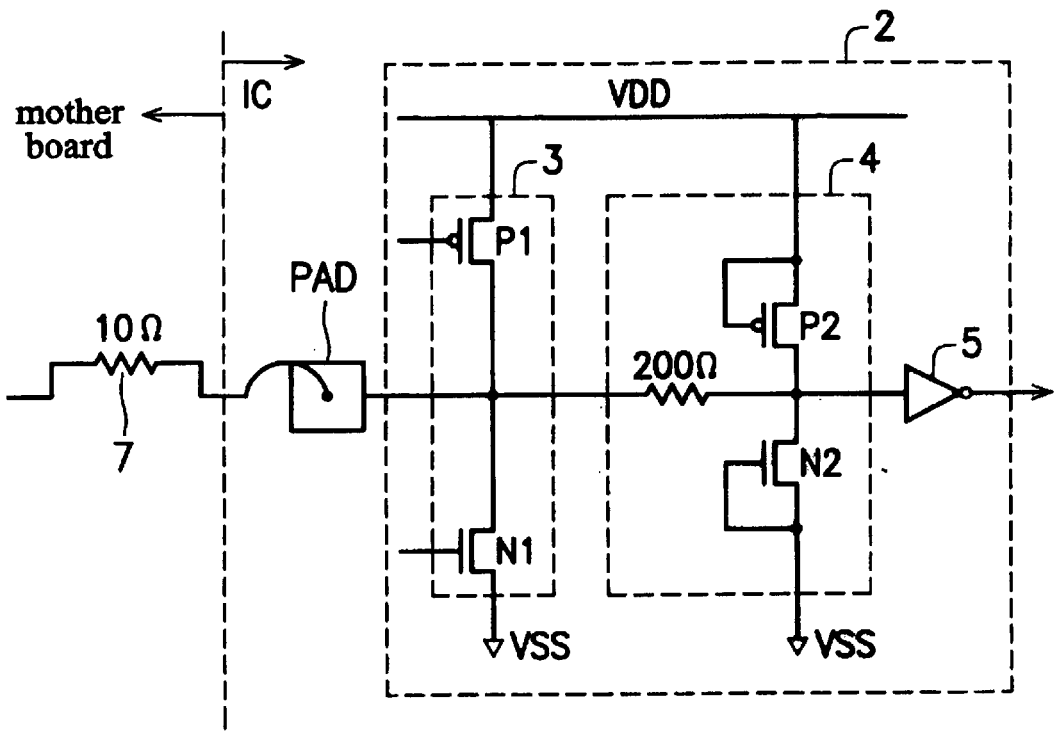
FIG. 1A is an O/I buffer of the conventional CMOS.
Figure 1B:
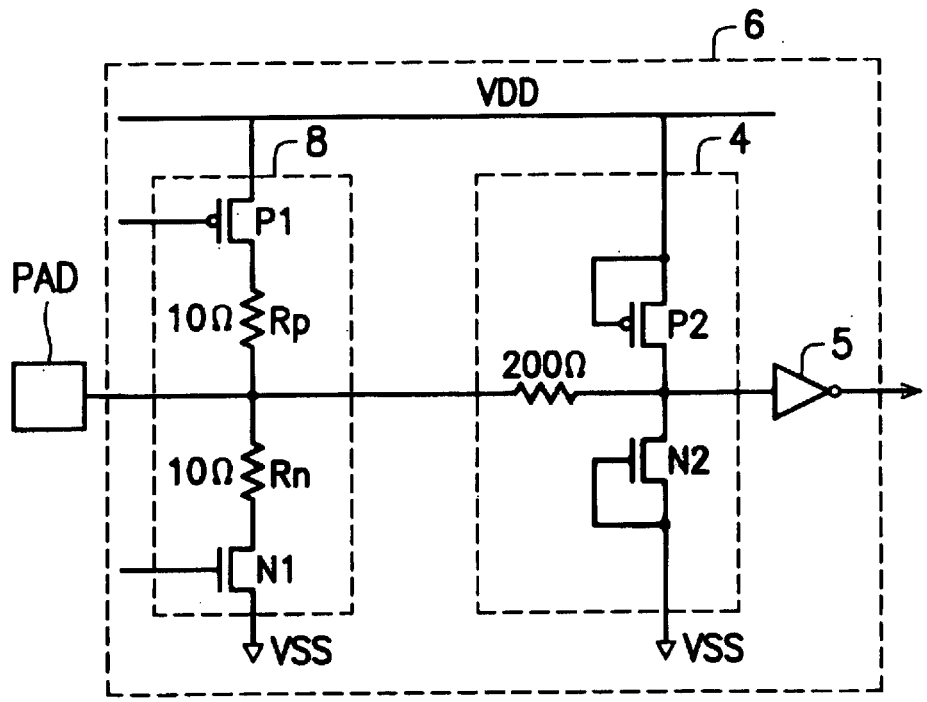
FIG. 1B is another O/I buffer of the conventional CMOS.
Figure 2:
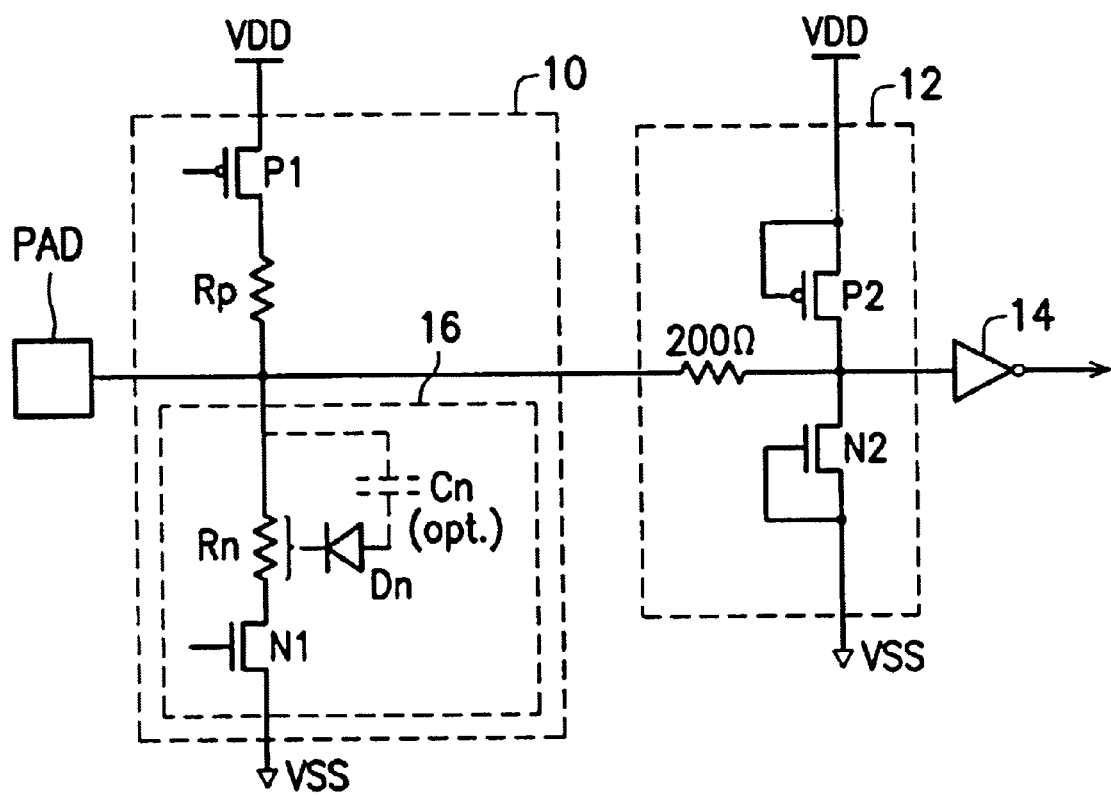
FIG. 2 is a schematic diagram of CMOS output buffer in the present invention.
Figure 3A:
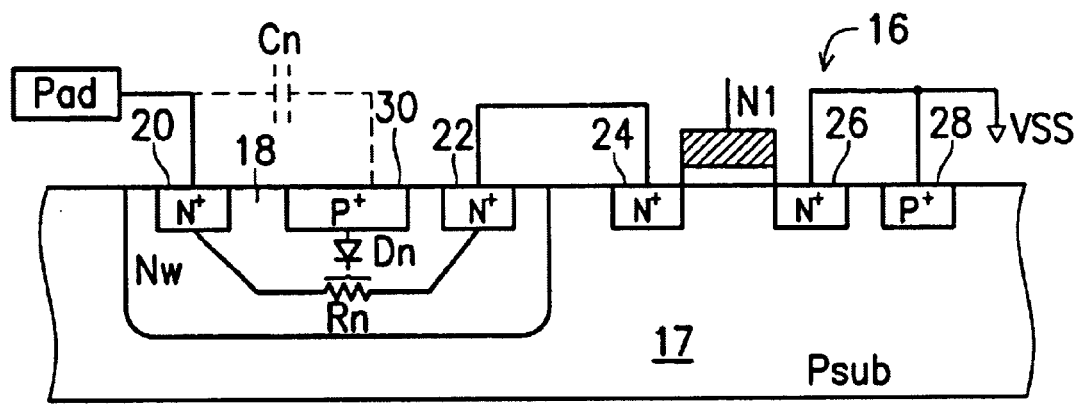
FIG. 3A is a schematic diagram of the pull down circuit of the first embodiment of the present invention in FIG. 2.
Figure 3B:
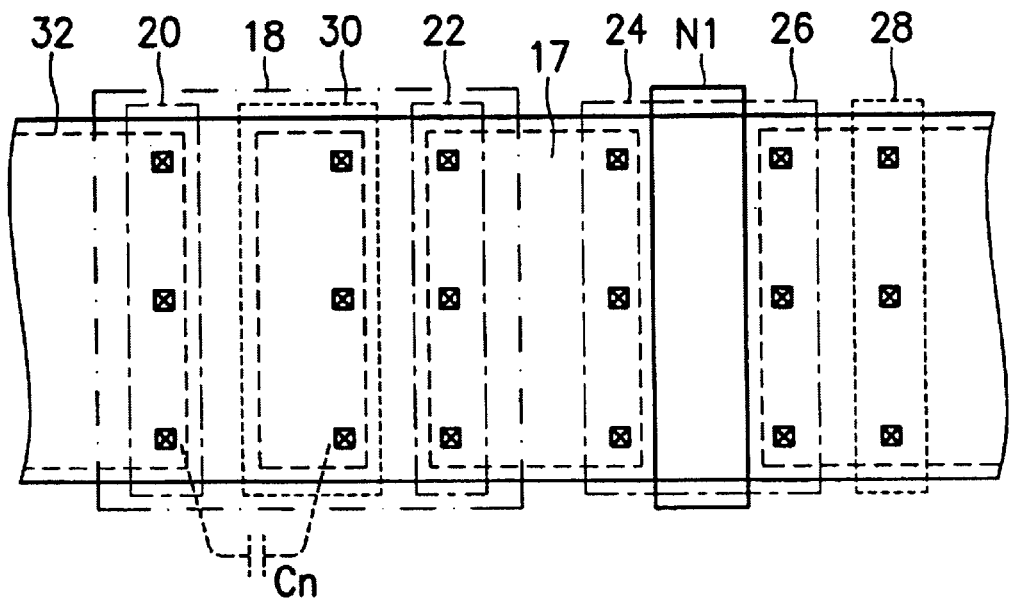
FIG. 3B is the top view of the embodiment in FIG. 3A.

FIG. 2 is a schematic diagram of CMOS output buffer in the present invention. FIG. 3A is a schematic diagram of the pull down circuit for illustrating the first embodiment of the present invention in FIG. 2. FIG. 3B is the top view of the embodiment in FIG. 3A. A CMOS I/O buffer comprises an input buffer 14, secondary ESD protection circuit 12 and an output buffer 10 of the present invention. Secondary ESD protection circuit 12 comprises a resistor of 200 ohms, a PMOS P2 and NMOS N2. The output buffer 10 of the present invention comprises a pull up circuit and pull down circuit 16. Pull up circuit comprises a series of PMOS P1 and a resistor Rp, coupled between a power line VDD and a pad. Pull down circuit 16 is coupled between a power line VSS and the pad. Pull down circuit 16 comprises a resistor Rn, a diode Dn and an ESD protection component. Resistor Rn is formed on p-type substrate 17, and is comprised of n-type well region 18. Resistor Rn comprises a first end and a second end. The first end is coupled to the pad. The first end and the second end are respectively an n-type doped region 20 and an n-type doped region 22 each at least partially overlapped with the n well. Diode Dn is deposited in the well region 18, and constructed by a PN junction formed between one p-type doped region 30 and n-type well 18. The ESD protection component, herein denoted as MOS N1, is connected between the second side and the power line VSS. MOS N1 comprises a gate, a drain and a source. The drain and the source are respectively comprised of a n-type doped region 24 and a n-type doped region 26. Drain 24 is electrically coupled to the second end of resistor Rn (n-type doped region 22), and the source 26 is electrically coupled to the power line VSS as shown in FIG. 3A. Substrate 17 usually uses a p-type doped region 28 as an electric contact for coupling to the power line VSS as shown in FIG. 3A. An optional capacitor Cn is coupled between the pad or the n-type doped region 20 and the p-type doped region 30. When the capacitance of capacitor gets larger, the transient coupling of the floated p-type doped region 30 to the n-type doped region 20 will get more sensitive. MOS N1 can be realized by a MOS transistor with large current driving ability. The occurrence of transient coupling makes the potential difference between the p-type doped region 30 and the n-type doped region 20 get closer at the ESD event. The IR drop of the n-type well region 18 during the ESD transient current charging makes the potential of the n-type well region 18 under the p-type doped region 30 become lower than the potential of the p-type doped region 30. Hence, the PN junction formed between the p-type doped region 30 and the n-type well region 18 is momentarily forward biased to inject the carrier (hole) into the n-type well region 18 and the p-type substrate 17, thereby, triggering the conductivity of the ESD protection component on the p-type substrate 17. For being more economical, the area of the MOS transistor with large current driving ability is reduced by forming a finger-shaped MOS transistor. The gate of MOS N1 may be coupled to a signal source or the power line VSS.

Referring to FIG. 2 to FIG. 3B, under normal operational conditions (non-ESD event), the p-type doped region 30 is in an electrically floated state such that the equivalent circuit of the pull down circuit comprises resistor Rn and MOS N1 only. Thereby the output buffer 16 of the present invention is able to suppress voltage ringing and overshooting as a conventional output buffer does. However, when an ESD event of positive impulse relevant to the power line VSS happens to a pad, the p-type doped region 30 is coupled to the n-type doped region 20. Both the parasitic pnp bipolar junction transistor (BJT), formed by the p-type doped region 30, the n-type well region 18 and the p-type substrate 17, and the npn BJT, formed by the n-type well region 18, the p-type substrate 17 and the n-type doped region 26, are triggered to produce a latch-up phenomenon which releases large ESD energy.

Figure 4A:
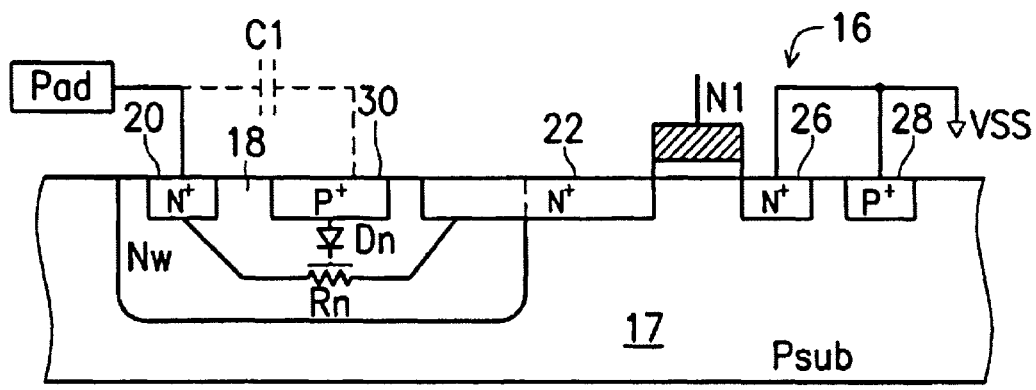
FIG. 4A is the schematic graph of the second embodiment of the pull down circuit shown in FIG. 2.
Figure 4B:
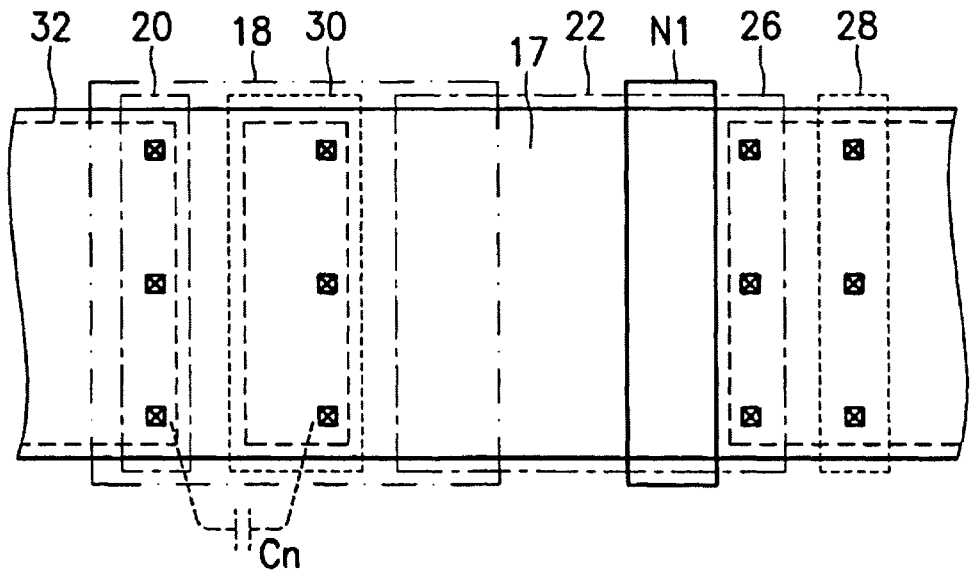
FIG. 4B is the top view of FIG. 4A.
Figure 4C:
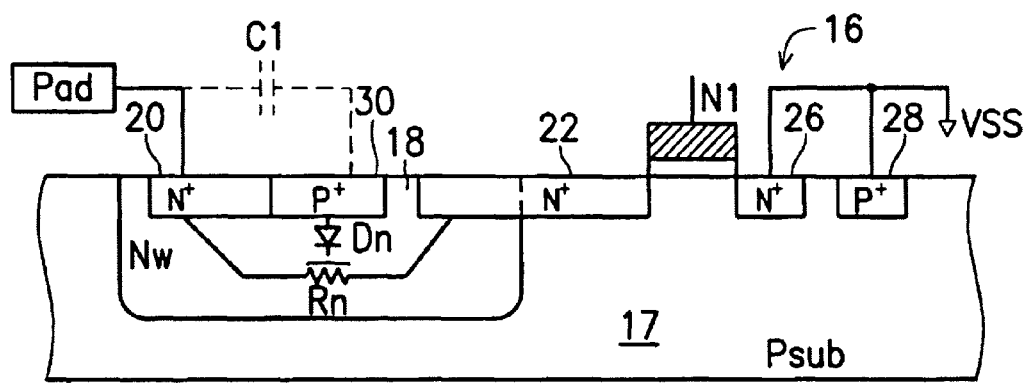
FIG. 4C is a modified circuit of FIG. 4A, with the n-type doped region in contact with the p-type doped region.

FIG. 4A is the cross section and schematic graph of the second embodiment of the pull down circuit shown in FIG. 2. FIG. 4B is the top view of FIG. 4A. The n-type doped region 22 may cross the boundary of the well region 18 to become the drain of MOS N1. By doing so, the connection between the n-type doped region 22 and the drain in FIG. 3A may be omitted. FIG. 4C is a modified structure of FIG. 4A showing the butting situation of the n-type doped region 20 and the p-typed doped region 30.

Figure 5:
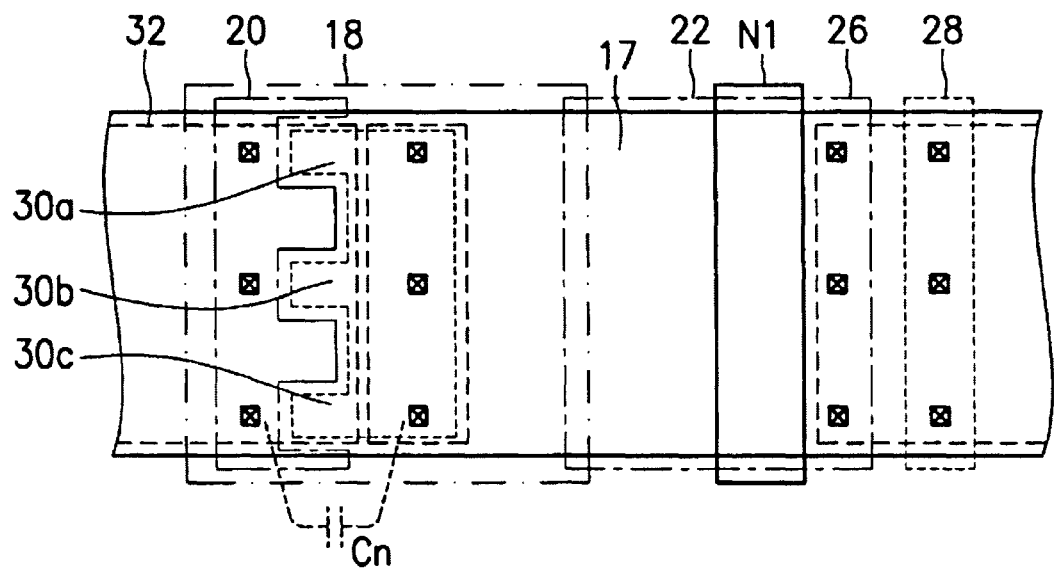
FIG. 5 is the schematic graph of the third embodiment of the pull down circuit in FIG. 2.
Figure 6:
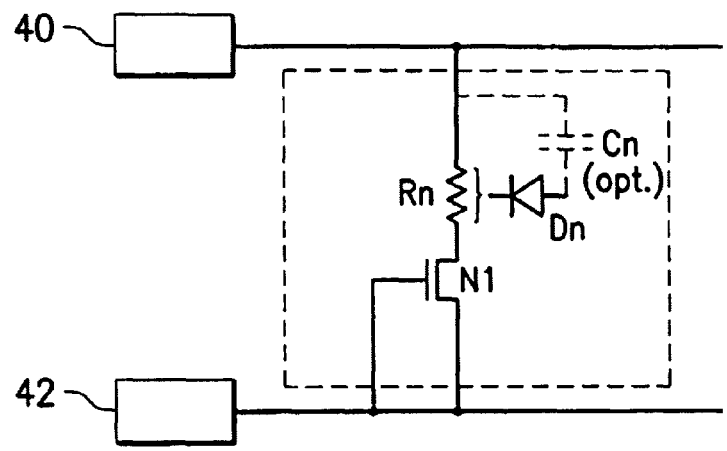
FIG. 6 is a schematic ESD protection graph of the present invention.

FIG. 5 is the schematic graph of the third embodiment of the pull down circuit in FIG. 2. Diode Dn may comprise at least two p-type doped regions, as 30a to 30c in FIG. 6. In FIG. 6, the first doped regions 30a to 30c are interlaced with the n-type doped region 20. Further, the metal layer 32 coupled to the n-type doped region 20 is overlapped with the p-type doped regions 30a to 30c. Thus, increasing the transient coupling between the p-type doped regions 30a to 30c and the n-type doped region 20 triggers the ESD current much easier.

The p-type doped region 30 and the n-type doped region 20 may be a distance away or have contact with each other. The butting of the p-type doped region 30 and the n-type doped region 20 increases the transient coupling between them.

Figure 7:
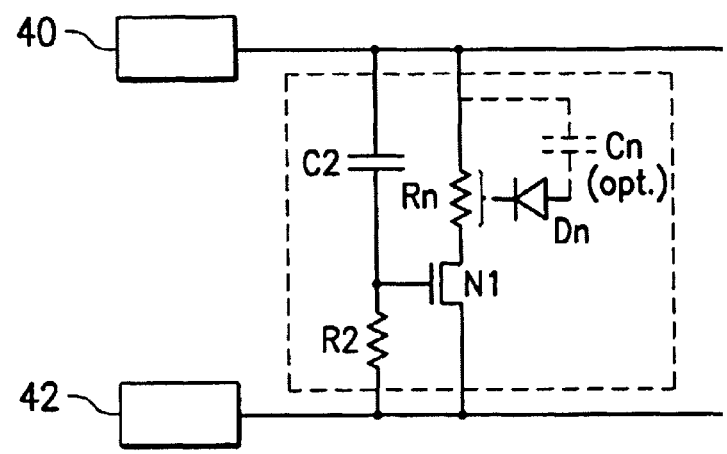
FIG. 7 is the schematic diagram of the second embodiment of the ESD protection circuit in FIG. 6.

Referring to FIG. 6 and FIG. 3A, FIG. 6 is a schematic ESD protection graph of the present invention. Using similar concept, the present invention may be used as an ESD protection circuit, coupled between a first pad 40 and a second pad 42, for conducting ESD current between the first pad 40 and the second pad 42. Both the first pad 40 and the second pad 42 may act as part of the I/O or power supply port. For example, the first pad 40 is coupled to an output port, the second port 42 is coupled to a power line. Another example is that, the first pad 40 and the second pad 42 are respectively coupled to a first and a second power line. The ESD protection circuit comprises a resistor Rn, a diode Dn and an ESD protection component. Resistor Rn coupled to a first pad 40 is constructed by an n-type well region 18 on a p-type substrate 17. Diode Dn is constructed of a PN junction formed between a p-type doped region 30 in well region 18. The ESD protection component is coupled between the second pad 42 and resistor Rn. In FIG. 7 and 3A, the ESD protection component is a n-type MOS N1, wherein MOS N1 consists a gate, a drain, a source and a substrate. The drain is coupled to resistor Rn, the source is coupled to the second pad 42. An optional capacitor Cn is coupled between the pad or the n-type doped region 20 and the p-type doped region 30. The p-type doped region 30 may be adopted according to various designing purpose accordingly. Wherein, the p-type doped region 30 is electrically floated or coupled to the first side with capacitor Cn. Because the p-type doped region 30 is not directly connected to the first side, there will be no latch-up issue occurring under normal operational conditions. The transient coupling between the first side and the p-type doped region 30 may help to trigger the conductivity of the ESD protection component and enhance the effect of ESD protection.

The gate of MOS is coupled to the second pad 42 as shown in FIG. 6. The ESD protection circuit also can comprise a delay circuit that consists of a RC-delay circuit consisting of a resistor R2 and a capacitor C2 connected in series. The delaying circuit is coupled between the first pad 40 and the second pad 42. The gate of the MOS is coupled to the connection node of resistor R2 and capacitor C2, as shown in FIG. 8. FIG. 7 is the schematic diagram of the second embodiment of the ESD protection circuit in FIG. 6.

Figure 8A:
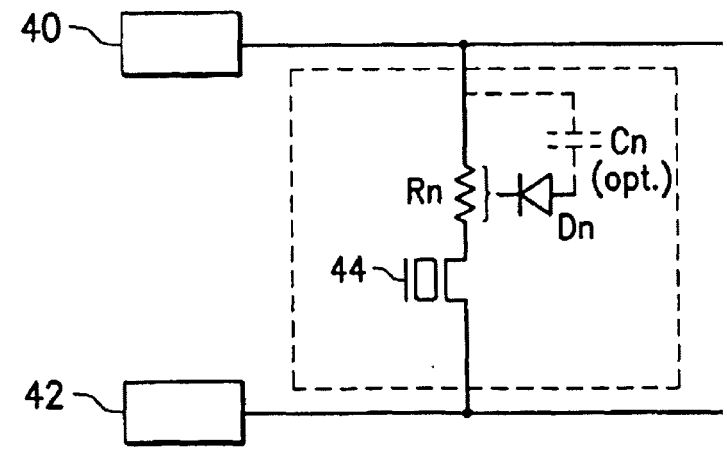
FIG. 8A is the third embodiment of the ESD protection circuit in FIG. 6.
Figure 8B:
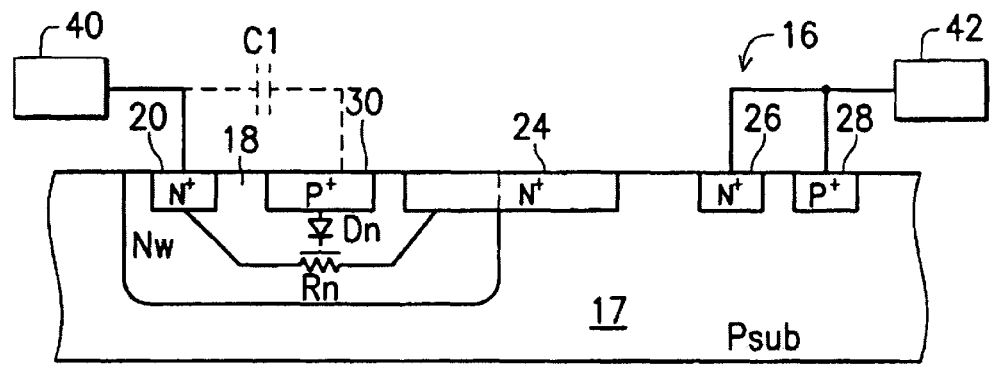
FIG. 8B is a sectional diagram of a type of transistor in FIG. 8A.
Figure 8C:
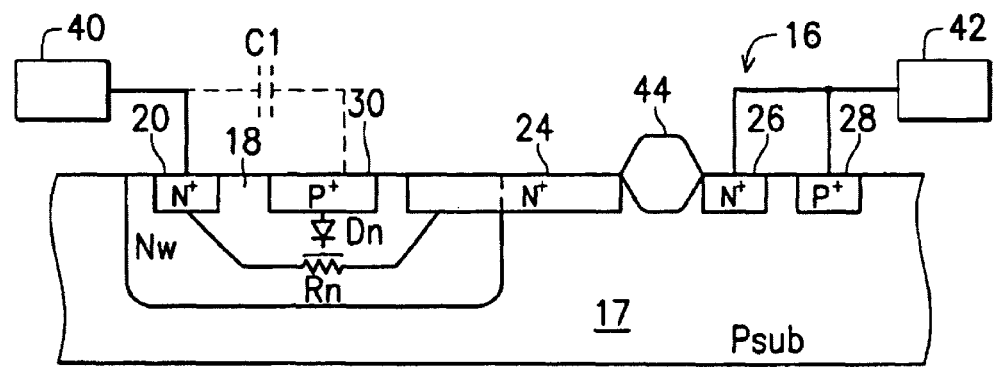
FIG. 8C a sectional diagram of another type of transistor in FIG. 8A.

Referring to FIGS. 8A to FIG. 8C, FIG. 8A is the third embodiment of the ESD protection circuit in FIG. 6. FIGS. 8B and 8C are two sectional diagrams realizing the circuit in FIG. 8A. The ESD protection component may be a field oxide MOS transistor (FOX MOS) 44 as shown in FIG. 8A. FOX MOS 44 comprises a n-type doped region 24 and a n-type doped region 26 as shown in FIG. 8B. FOX MOS 44 may further comprise a field oxide layer 44 between the n-type doped region 24 and the n-type doped region 26 as shown in FIG. 9C.

Figure 9A:
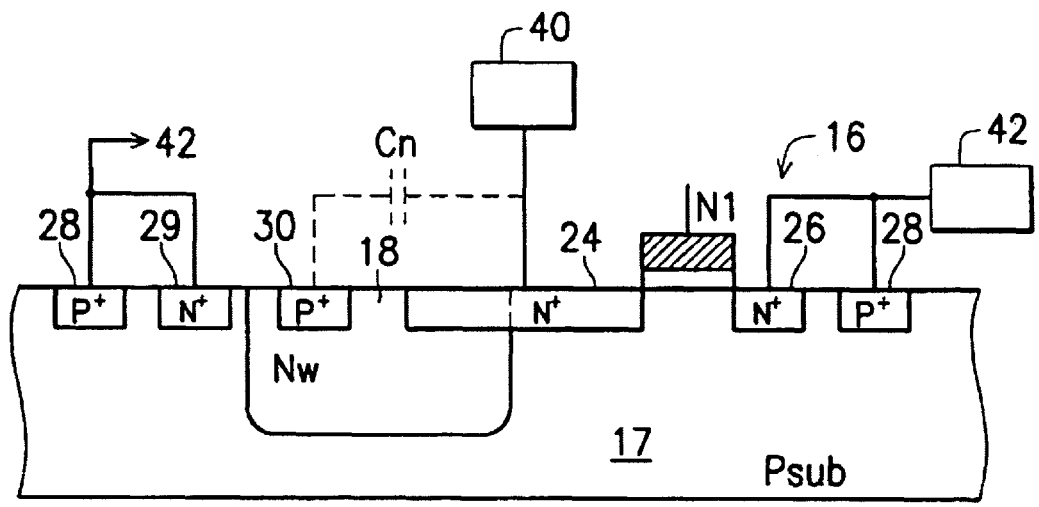
FIG. 9A is a fourth embodiment of the ESD protection circuit in FIG. 6.
Figure 9B:
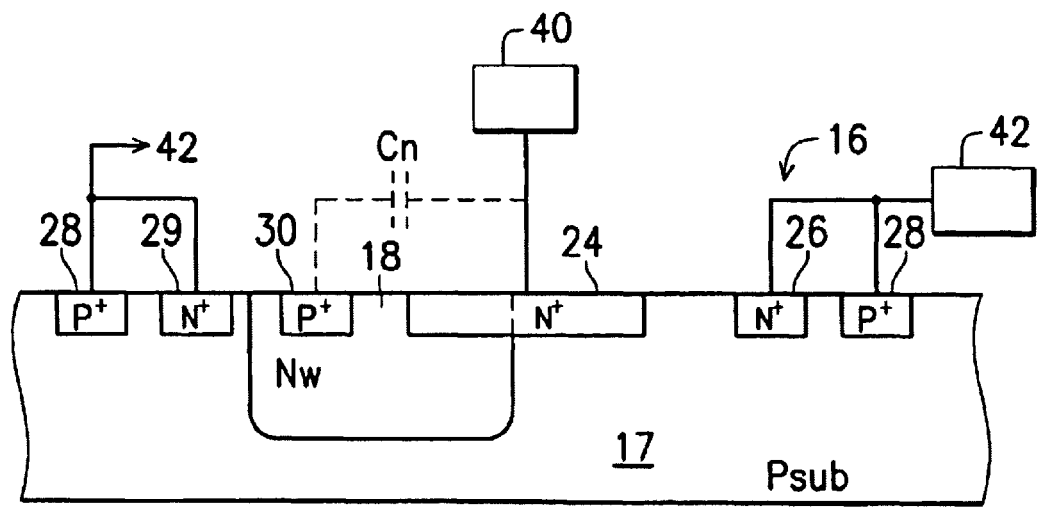
FIG. 9B is the fifth embodiment of the ESD protection circuit in FIG. 6.

FIG. 9A is a fourth embodiment of the ESD protection circuit in FIG. 6, and FIG. 9B is the fifth embodiment of the ESD protection circuit in FIG. 6. The drain of the MOS N1 (the n-type doped region 24) may be coupled to the first pad 40 as shown in FIG. 10A to realize the ESD protection circuit in FIG. 6. The p-type doped region 28 can be arranged to surround the frame of the ESD protection circuit as a guard ring. Additionally, between the well region 18 and the p-type doped region 28, where no MOS N1 is configured, an n-type doped region 29 may be added and coupled to the second pad as shown in the left part of FIG. 9A. Therefore, not only the right part of the circuit in FIG. 9 provides ESD protection, the left part also provides ESD protection which ensures that the whole IC avoids damage during an ESD event. As described before, MOS N1 can be replaced by a field oxide device as shown in FIG. 9B. A field oxide device comprises two n+ doped region separated by a field oxide layer over p well or p-substrate.

Figure 10:
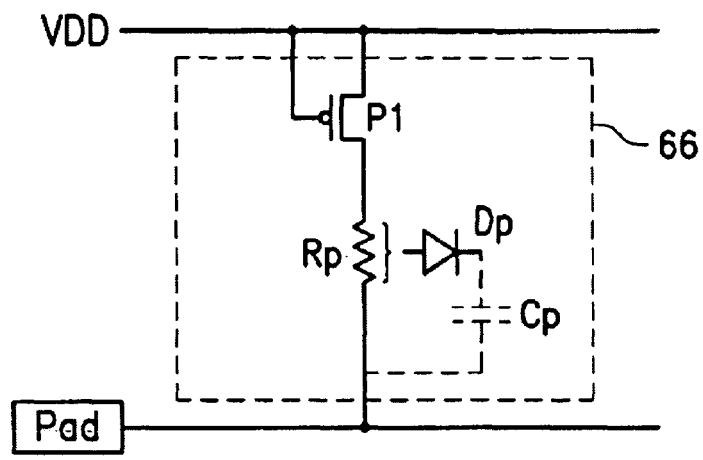
FIG. 10 is an embodiment of that the first conductivity type is p-type and the second conductivity type is n-type.
Figure 11:
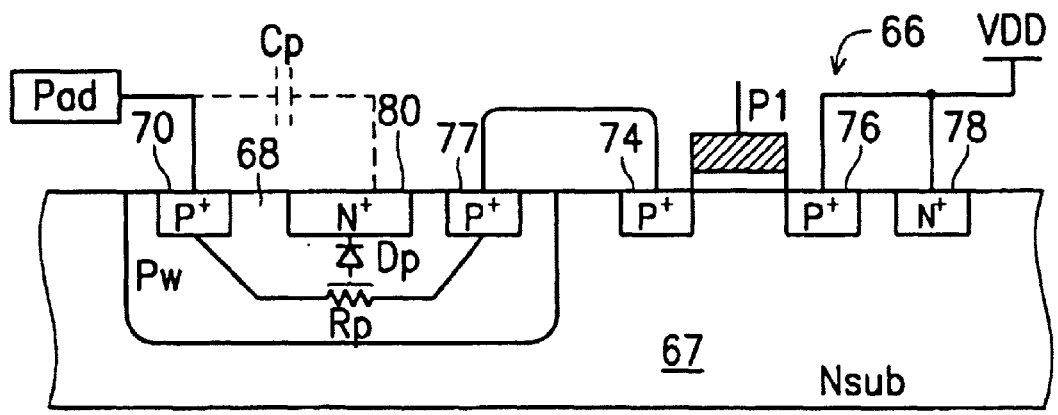
FIG. 11 is a sectional diagram of the circuit in FIG. 10.

If the first conductivity type is a n-type, the second conductivity type is a p-type, referring to FIGS. 3 and 9B. On the other hand, if the first conductivity type is a p-type, the second conductivity type is a n-type. FIG. 10 is an exampled embodiment of that the first conductivity type which is a p-type and the second conductivity type which is an n-type. FIG. 11 is a sectional diagram of the circuit in FIG. 10. The ESD protection circuit 66 is coupled between the power line VDD and the pad. It is common in the art to switch the n and the p types. Refer to FIG. 10 and FIG. 11 as two examples.

Compared to the conventional output buffer, there is an extra diode electrically floated in the well region which is used as a resistor. Therefore, under normal operations, the diode of the output buffer of the invention is not triggered, thus the voltage ringing and overshooting are suppressed by the resistor. When encountering an ESD event, the diode is transient coupled to the pad to trigger the conductivity of the ESD protection circuit. Hereby, the present invention provides an output buffer with both the ability to suppress the voltage overshooting, ringing and the capability of ESD protection.

Figure 12A:
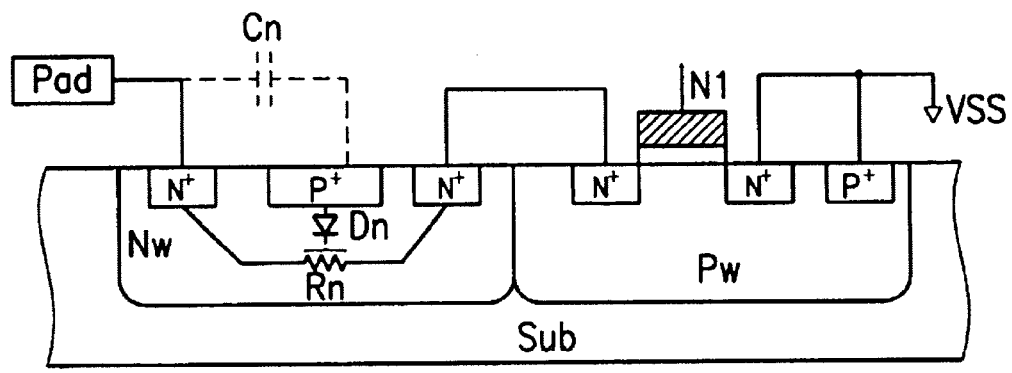
FIGS. 12A and 12B are schematic diagrams of the two twin well structures of the present invention.
Figure 12B:
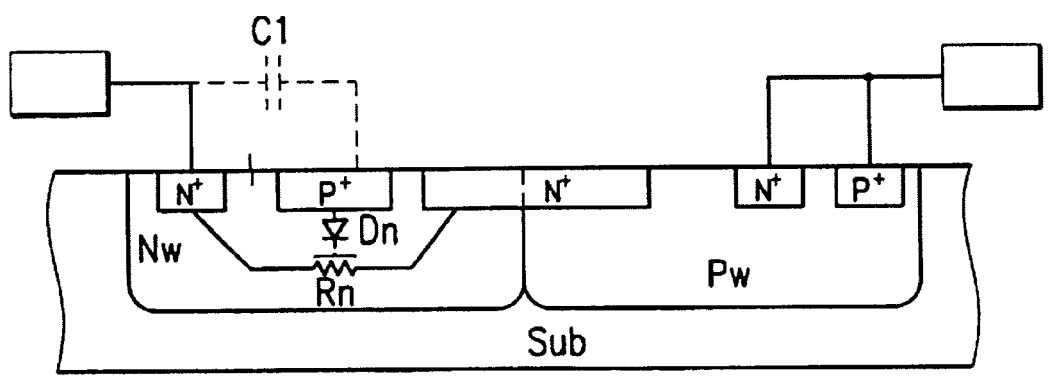

The substrate and the well region described in the previous paragraphs invention can be replaced by a well region and a substrate, respectively. Therefore, the structure of N-well/P-sub may be replaced with N-sub/P-well or N-well/P-well (twin well structure) as shown in FIGS. 12A and 12B.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Similarly, any process steps described herein may be interchangeable with other steps in order to achieve the same result. Therefore, the scope of the appended claims should be accorded the broadest interpretation so as to encompass all such modifications and similar arrangements, which is defined by the following claims and their equivalents.

What is claimed is:

1. An electrostatic discharge protection circuit coupled between a first node and a second node, comprising:
   a substrate of a first conductivity type;
   a first doped region and a second doped region of a second conductivity type formed in the substrate, the first doped region and the second doped region being spaced apart enabling a channel region formed in between;
   a well region of the second conductivity type, formed in the substrate; and
   a fourth doped region and a fifth doped region of the second conductivity type formed in the well region, the fourth doped region coupled to the first node; and a third doped region of the first conductivity type disposed within the well region, wherein the third doped region is electrically floated and is spaced apart from the fourth doped region, the first node is electrically coupled to the first doped region through the fourth doped region, the well region, and the fifth doped region, and the second node is electrically coupled to the second doped region.

2. An electrostatic discharge protection circuit coupled between a first node and a second node, comprising:

a substrate of a first conductivity type;

a first doped region and a second doped region of a second conductivity type formed in the substrate, the first and second doped regions being spaced apart enabling a channel formed in between;

a resistor constructed by a well region of a second conductivity type being disposed on the substrate, the resistor comprising a fourth doped region and a fifth doped region of the second conductivity type; the fourth doped region coupled to the first node; and a third doped region of the first conductivity type disposed within the well region, wherein the third doped region is coupled to the first node through a capacitor; the third doped region is spaced apart from the fourth doped region; the first node is electrically coupled to the first doped region through the fourth doped region, the well region, and the fifth doped region; and the second node is electrically coupled to the second doped region.

3. The electrostatic discharge protection circuit of claim 2, wherein the third doped region is disposed between the fourth doped region and the fifth doped region.

4. The electrostatic discharge protection circuit of claim 2, wherein the third doped region is spaced apart from the fifth doped region.

* * * * *